US012211685B2

(12) United States Patent
Leeser

(10) Patent No.: US 12,211,685 B2
(45) Date of Patent: Jan. 28, 2025

(54) JOINING TECHNIQUES FOR COMPOSITE CERAMIC BODIES

(71) Applicant: Lam Research Corporation, Fremont, CA (US)

(72) Inventor: Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/688,223

(22) PCT Filed: Aug. 29, 2022

(86) PCT No.: PCT/US2022/075609
§ 371 (c)(1),
(2) Date: Feb. 29, 2024

(87) PCT Pub. No.: WO2023/034760
PCT Pub. Date: Mar. 9, 2023

(65) Prior Publication Data
US 2024/0379316 A1 Nov. 14, 2024

Related U.S. Application Data

(60) Provisional application No. 63/260,865, filed on Sep. 2, 2021.

(51) Int. Cl.
*H01J 9/34* (2006.01)
*C04B 37/00* (2006.01)
*H01J 37/32* (2006.01)

(52) U.S. Cl.
CPC .............. *H01J 9/34* (2013.01); *C04B 37/001* (2013.01); *H01J 37/32715* (2013.01);
(Continued)

(58) Field of Classification Search
CPC .... H01J 9/34; C04B 37/001; C04B 2237/343; C04B 2237/366; C04B 2237/58
See application file for complete search history.

(56) References Cited

U.S. PATENT DOCUMENTS

2007/0166570 A1* 7/2007 Cutler .................. C04B 37/005
428/701
2016/0348244 A1 12/2016 Sabri et al.
(Continued)

FOREIGN PATENT DOCUMENTS

WO   WO-2019088203 A1   5/2019

OTHER PUBLICATIONS

International Search Report and Written Opinion dated Dec. 9, 2022 in PCT Application No. PCT/US2022/075609.
(Continued)

*Primary Examiner* — Joseph L Williams
(74) *Attorney, Agent, or Firm* — Weaver Austin Villeneuve & Sampson LLP

(57) ABSTRACT

In joining composite ceramic bodies, at least one ceramic body is a compositionally graded with varying concentrations between two or more ceramic materials. The compositionally graded ceramic body terminates at an interfacial layer that is substantially composed of a single ceramic material. The compositionally graded ceramic body is joined to another ceramic body that may also be compositionally graded or made of a single ceramic material, and an interfacial layer of the other ceramic body is identical in composition with the interfacial layer of the compositionally graded ceramic body. In some embodiments, the ceramic bodies may be joined by diffusion bonding. In some embodiments, the ceramic bodies include a ceramic platen and ceramic stem of a wafer pedestal implemented in a plasma processing apparatus.

21 Claims, 7 Drawing Sheets

(52) U.S. Cl.
CPC .. *H01J 37/32807* (2013.01); *C04B 2237/343* (2013.01); *C04B 2237/366* (2013.01); *C04B 2237/58* (2013.01); *H01J 37/3244* (2013.01)

(56) References Cited

U.S. PATENT DOCUMENTS

| | | |
|---|---|---|
| 2017/0321324 A1 | 11/2017 | Gomm et al. |
| 2021/0086277 A1 | 3/2021 | Elliot et al. |
| 2021/0154776 A1 | 5/2021 | Elliot et al. |

OTHER PUBLICATIONS

International Preliminary Report on Patentability and Written Opinion dated Mar. 14, 2024 in PCT Application No. PCT/US2022/075609.

* cited by examiner

JOINING TECHNIQUES FOR COMPOSITE CERAMIC BODIES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD

Implementations herein relate to joining ceramic objects and, more particularly to joining composite ceramic objects used in semiconductor processing applications.

BACKGROUND

Ceramic articles generally possess excellent properties of high temperature resistance and high chemical resistance and are useful in the fields of electronics, automotive, aerospace, chemical, semiconductor industry, and so on. However, industrial or commercial products are rarely monolithic. Ceramic bodies may be difficult to machine, so many ceramic bodies have a relatively simple mechanical design. Joining ceramic bodies together may be needed in assembling complex structures. Examples of joining techniques include adhesive bonding, brazing, glass frit joining, mechanical fastening, co-sintering, diffusion bonding, fusion welding, and friction welding. In brazing, a metal interlayer is provided between materials to be bonded. In diffusion bonding, bonding occurs through plastic deformation and solid-state diffusion across an interface with application of elevated temperature and contact pressure.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of joining ceramic bodies for use in a semiconductor processing apparatus. The method includes providing a first ceramic body and a second ceramic body, where at least the first ceramic body is made of a mixture of two or more ceramic materials, where the first ceramic body is graded compositionally to terminate at a first interfacial portion so that a composition at the first interfacial portion consists essentially of one of the two or more ceramic materials, and where the second ceramic body has a second interfacial portion with a composition that is the same or substantially the same as the first interfacial portion, and contacting the first interfacial portion of the first ceramic body with the second interfacial portion of the second ceramic body. The method further includes diffusion bonding the first ceramic body with the second ceramic body to form a hermetic or substantially hermetic joint at an interface between the first interfacial portion and the second interfacial portion.

In some implementations, the two or more ceramic materials are ceramic mixtures of at least aluminum nitride and alumina. In some implementations, a composition at the first interfacial portion and a composition at the second interfacial portion each consists essentially of aluminum nitride or alumina. In some implementations, the two or more ceramic materials are ceramic mixtures that further include aluminum oxynitride. In some implementations, the first ceramic body is a platen of a wafer pedestal and the second ceramic body is a stem of the wafer pedestal. In some implementations, the first ceramic body is a faceplate and/or backplate of a showerhead and the second ceramic body is a stem of the showerhead. In some implementations, the second ceramic body is graded compositionally to terminate at the second interfacial portion so that the composition at the second interfacial portion is the same or substantially the same as the first interfacial portion. In some implementations, a composition of the second ceramic body is the same or substantially the same ceramic material as the first interfacial portion. In some implementations, the method further includes forming the first ceramic body to be compositionally graded between the two or more ceramic materials by depositing a plurality of layers of varying compositions by atomic layer deposition (ALD) or chemical vapor deposition (CVD). In some implementations, the method further includes forming the first ceramic body to be compositionally graded between the two or more ceramic materials by forming a plurality of layers of varying compositions from powder mixtures and combining the plurality of layers by hot pressing. In some implementations, the first ceramic body includes a platen comprising a mixture of aluminum nitride and alumina and terminates in the first interfacial portion that consists essentially of aluminum nitride, and wherein the second ceramic body includes a stem comprising aluminum nitride, alumina, or combinations thereof and that terminates in the second interfacial portion that consists essentially of aluminum nitride. In some implementations, the first ceramic body includes a platen comprising a mixture of aluminum nitride and alumina and terminates in the first interfacial portion that consists essentially of alumina, and wherein the second ceramic body includes a stem comprising aluminum nitride, alumina, or combinations thereof and that terminates in the second interfacial portion that consists essentially of alumina. In some implementations, the first ceramic body includes a platen comprising a mixture of aluminum nitride and alumina and terminates in the first interfacial portion that consists essentially of aluminum oxynitride, and wherein the second ceramic body includes a stem comprising aluminum nitride, alumina, or combinations thereof and that terminates in the second interfacial portion that consists essentially of aluminum oxynitride. In some implementations, each of the first interfacial portion and the second interfacial portion has a thickness equal to or greater than about 10 μm.

Also provided herein is a reactor component configured for use in a semiconductor processing apparatus. The reactor component includes a first ceramic body comprising a mixture of two or more ceramic materials, where the first ceramic body is compositionally graded to terminate in a first interfacial portion so that a composition of the first interfacial portion consists essentially of a single ceramic material of the two or more ceramic materials, and a second ceramic body, where the second ceramic body has a second interfacial portion so that a composition of the second interfacial portion is the same or substantially the same as the first interfacial portion, where the first interfacial portion and the second interfacial portion form a joint by diffusion bonding.

In some implementations, the two or more ceramic materials are ceramic mixtures of at least aluminum nitride and alumina. In some implementations, the first ceramic body is a platen of a wafer pedestal and the second ceramic body is a stem of the wafer pedestal. In some implementations, the first ceramic body is a faceplate and/or backplate of a gas distributor and the second ceramic body is a stem of the gas distributor. In some implementations, the second ceramic body comprises a mixture of the two or more ceramic materials, where the second ceramic body is graded compositionally to terminate at the second interfacial portion so that the composition at the second interfacial portion is the same or substantially the same as the first interfacial portion. In some implementations, an interface between the first interfacial portion and the second interfacial portion forms a hermetic or substantially hermetic joint. In some implementations, each of the first interfacial portion and the second interfacial portion has a thickness equal to or greater than about 10 µm.

DETAILED DESCRIPTION

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

INTRODUCTION

Reactor components in semiconductor processing applications often deteriorate over time and have limited lifetimes. If the lifetime is short, then the cost of ownership for the reactor component is high. Reactor components such as showerheads and wafer pedestals may be fabricated out of metals (e.g., aluminum, stainless steel, etc.), plastics, or ceramics. Ceramic materials are often chosen for reactor components because of their high temperature resistance and high chemical resistance.

A semiconductor processing apparatus or reactor chamber may process one or more semiconductor substrates. The semiconductor processing apparatus may employ harsh reaction conditions such as elevated temperatures, plasmas, and various reactive species. Such harsh reaction conditions may be applied during cleaning, etching, doping, deposition, or other processing step. The reaction conditions may lead to degradation of semiconductor processing equipment over time. For example, a plasma processing apparatus may strike or ignite plasma, which includes a mixture of ions and radicals. When performing chamber dry cleans, the plasma processing apparatus may expose various reactor components to halogens such as fluorine gas (or fluorine radicals). Oxidizing chemistries such as fluorine chemistries create a harsh and corrosive environment that can degrade many different types of materials including metals and metal oxides. Accordingly, reactor components made of ceramic materials need to withstand the harsh and corrosive environments in plasma processing apparatuses.

One of the reactor components typically found in a semiconductor processing apparatus is a wafer pedestal or susceptor. Wafer pedestals can be fabricated by joining two or more dissimilar members. This can include joining a small diameter stem to a disk (platen) of material.

Figure 1:
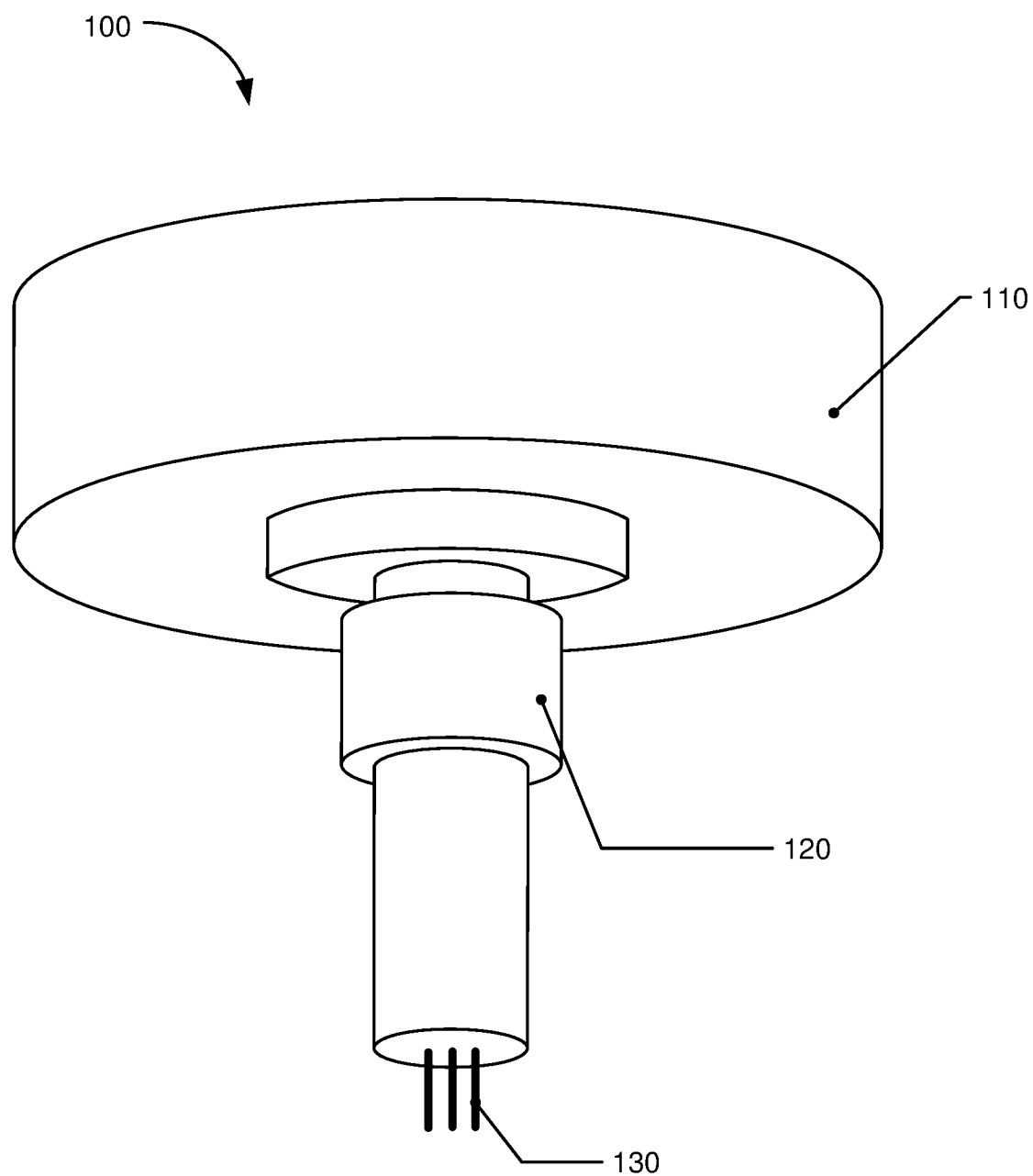
FIG. 1 shows a schematic illustration of a wafer pedestal including a ceramic stem joined to a ceramic platen according to some implementations.

FIG. 1 shows a schematic illustration of a wafer pedestal including a ceramic stem joined to a ceramic platen according to some implementations. A wafer pedestal 100 may be referred to as a substrate support structure and can be used for transporting and/or holding a semiconductor substrate in a chamber during processing. The wafer pedestal 100 includes a ceramic platen 110 that may have a disk-shaped top plate on which the semiconductor substrate is held. The ceramic platen 110 may be supported by a ceramic stem 120 that may be a downwardly extending tube. Each of the ceramic platen 110 and the ceramic stem 120 of the wafer pedestal 100 incorporates ceramic materials such as aluminum oxide (alumina), aluminum nitride, yttria, boron nitride, silicon oxide, silicon carbide, silicon nitride, titanium oxide, zirconium oxide, spinel, or other suitable ceramic material.

One or more electrodes (not shown) may be optionally embedded in the ceramic platen 110, where the one or more electrodes may be made of electrically conductive or semi-conducting material. Examples of such electrodes include clamping electrodes and radio-frequency (RF) electrodes. Additionally, one or more heaters (not shown) such as resistive heaters may be optionally incorporated in the ceramic platen 110 for temperature control. Electrical power lines 130 may supply electrical current to power the heaters and/or electrodes. The ceramic stem 120 may be a hollow connecting tube adapted to carry the electrical power lines 130. In some instances, the ceramic stem 120 may be a thin-walled small-diameter tube that connects to the ceramic platen 110.

The ceramic platen 110 and ceramic stem 120 are typically fabricated separately and then joined together. Each of the ceramic platen 110 and the ceramic stem 120 may be fabricated using a conventional process, where the fabrication process may involve mixing ceramic powder with binder material, forming the ceramic powder into a desired shape, and firing/sintering the ceramic powder to fuse ceramic particles together, thereby forming a solid mass of ceramic material. The ceramic platen 110 and the ceramic stem 120 are joined together using a conventional joining process such as co-firing, friction welding, diffusion bonding, and brazing.

In some instances, an interior of the ceramic stem 120 may be at atmospheric pressure. The interior of the ceramic stem 120 may house electrical power lines 130. In some implementations, the interior of the ceramic stem 120 or the interior of the electrical power lines 130 (e.g., hollow electrical feed rods) may have cavities for delivery of gas to an underside of the semiconductor substrate supported on the wafer pedestal 100. For maintaining atmospheric pressure and/or delivery of gases to the underside of the semiconductor substrate, the ceramic stem 120 should be hermetic or substantially hermetic. Furthermore, a joint between the ceramic stem 120 and the ceramic platen 110 should be hermetic (i.e., leak-tight) or substantially hermetic, especially in the face of thermally induced stresses at the joint.

In some instances, heaters and electrodes are embedded inside the ceramic platen 110 of the wafer pedestal 100. To ensure heat transfer to the semiconductor substrate, the ceramic platen 110 may be made of ceramic material having high thermal conductivity. Furthermore, to ensure electrical isolation of the semiconductor substrate, the ceramic platen 110 may be electrically insulating.

Another one of the reactor components typically found in a semiconductor processing apparatus is a showerhead or a gas distributor. Showerheads can be fabricated by joining two or more dissimilar members.

Figure 2:
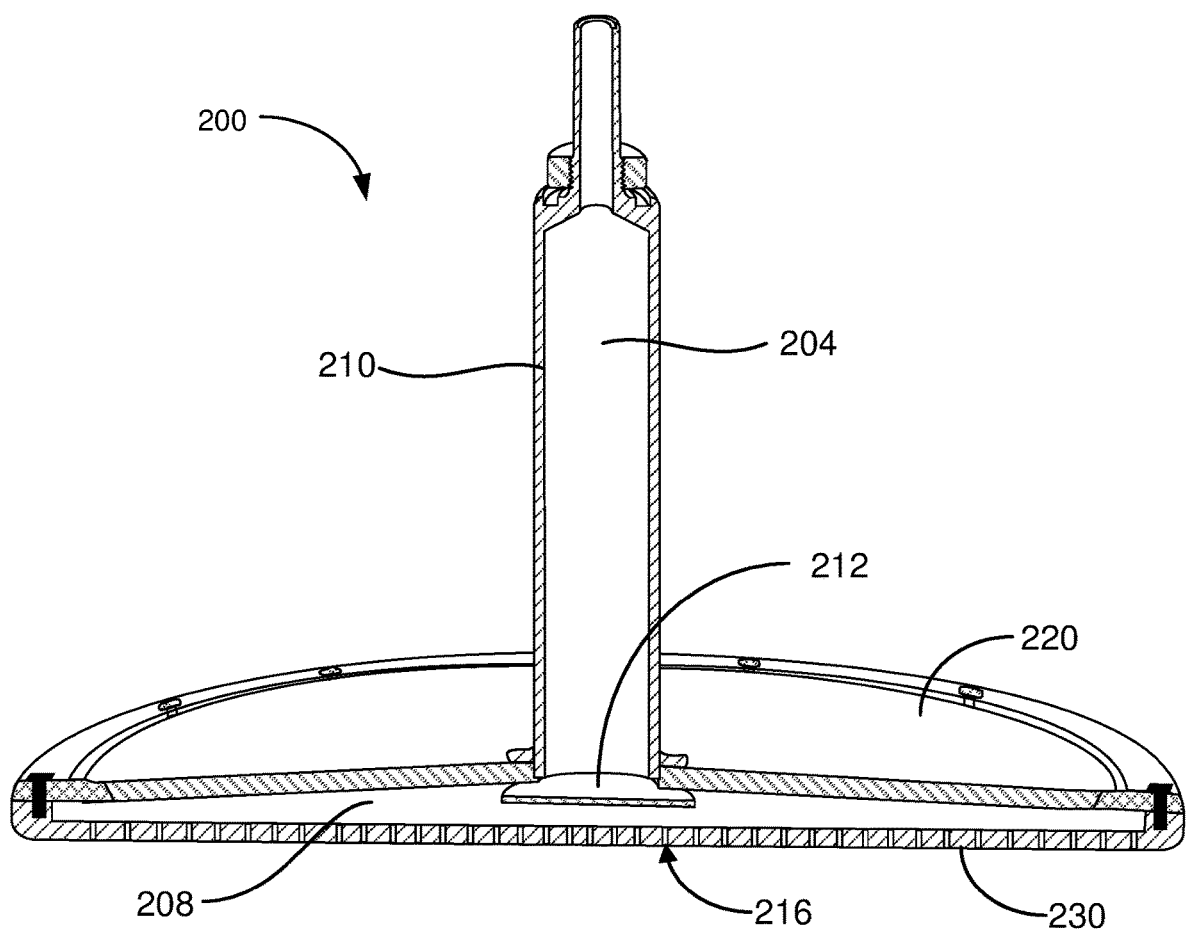
FIG. 2 shows a schematic illustration of a showerhead including a ceramic faceplate joined to a ceramic backplate or stem according to some implementations.

FIG. 2 shows a schematic illustration of a showerhead including a ceramic faceplate joined to a ceramic backplate or stem according to some implementations. A showerhead 200 may include a stem 210, a backplate 220, and a faceplate 230. The stem 210 and the backplate 220 may be separate mechanical components or may be integrated into a single body. In some cases, the stem 210 may be a flanged stem that joins to the backplate 220 to withstand hot pressing. Similarly, the backplate 220 and the faceplate 230 may be separate mechanical components or may be integrated into a single body. For example, two or more of these components may be manufactured together from a single block of material or may be attached together after fabrication (e.g., diffusion bonded). In some cases, a separable faceplate 230 may be attached to the backplate 220 via fasteners.

In the stem 210, process gases may flow through a gas feed channel 204 before entering a plenum volume 208 defined between the backplate 220 and the faceplate 230. The plenum volume 208 may include a baffle 212 for distributing the process gases evenly throughout the plenum volume 208. The faceplate 230 has a plurality of holes or perforations 216 to provide distribution of process gases from the plenum volume 208 to a process chamber. At least two of the stem 210, the backplate 220, and the faceplate 230 may be made of ceramic materials such as alumina, aluminum nitride, spinel, or other suitable ceramic material.

In some implementations, the showerhead 200 may include one or more electrodes (not shown), where the one or more electrodes may be made of electrically conductive or semiconducting material. By way of an example, RF power may be supplied to the one or more electrodes to facilitate plasma generation in the process chamber, as in the case of capacitively coupled plasma (CCP) generation. In some implementations, the showerhead 200 may incorporate heating elements (not shown) for temperature control. For example, heating elements may be installed in the stem 210 and/or backplate 220 for controlling a temperature of the showerhead 200.

The stem 210 and the backplate 220 may be fabricated separately and then joined together. Additionally or alternatively, the backplate 220 and the faceplate 230 may be fabricated separately and then joined together. Joining techniques include but are not limited to co-firing, friction welding, diffusion bonding, and brazing. At least two of the stem 210, the backplate 220, and the faceplate 230 may be fabricated using a conventional process, where the fabrication process may involve mixing ceramic powder with binder material, forming the ceramic powder into a desired shape, and firing/sintering the ceramic powder to fuse ceramic particles together, thereby forming a solid mass of ceramic material.

In some instances, the joint between the stem 210 and the backplate 220 and/or the joint between the backplate 220 and the faceplate 230 should be hermetic or substantially hermetic. In some instances, one or more of the stem 210, the backplate 220, and the faceplate 230 may be made of a ceramic material having high thermal conductivity.

Reactor components such as showerheads and wafer pedestals are frequently made of alumina or aluminum nitride. Alumina is an electrically insulating ceramic material that is able to withstand high temperatures. Alumina is a naturally occurring material that is ubiquitous, making it a cost-efficient material. Additionally, alumina is easily machinable during fabrication. However, alumina is more vulnerable to harsh environments and corrosive gases including fluorine gases. Alumina also generally has a low thermal conductivity, where the thermal conductivity can range between about 10 W/m-K and about 30 W/m-K. Aluminum nitride is an electrically insulating ceramic material that is able to withstand even higher temperatures than alumina. Moreover, aluminum nitride highly resistant to corrosion including corrosion by fluorine gases and other reactive species. Aluminum nitride has high thermal conductivity that can range between about 82 W/m-K and about 170 W/m-K. Further, it is well known that aluminum nitride has high thermal shock resistivity and has a volume resistivity greater than about $10^{14}$ Ω-cm at room temperature. Aluminum nitride is a popular choice of ceramic material used in semiconductor processing applications because of its favorable plasma resistance, volume resistivity control, thermal shock resistance, and relatively high thermal conductivity for a ceramic material. However, aluminum nitride is not easily machinable during fabrication. Aluminum nitride is not naturally occurring and requires additional processing steps for synthesis. In fact, aluminum nitride requires a sintering temperature that is rather high (e.g., above 2000° C.), which substantially increases costs.

Composite Ceramic Materials

Composite ceramic materials offer materials with properties that may not be achieved by certain ceramic materials alone. Thus, composite ceramic materials may exhibit unique electrical, thermal, and mechanical properties. Generally speaking, composite ceramic materials comprise two or more ceramic materials providing two or more crystal structures. Composite ceramic materials may be fabricated from mixtures of ceramic powders. Multiple base powders may be employed to produce ceramic mixtures such as ceramic mixtures of aluminum nitride and alumina. The ceramic mixtures may form thermodynamically stable solid solutions (e.g., aluminum oxynitride) or heterogeneous mixtures (e.g., alumina and aluminum nitride). A phase of the composite ceramic material may be ascertained from a binary, ternary, or multi-component phase diagram.

More and more composite ceramic materials are being researched and explored to achieve desired properties. For example, though aluminum nitride exhibits strong plasma resistance, volume resistivity control, and relatively high thermal conductivity, aluminum nitride is expensive, difficult to machine, and vulnerable to diffusion of fluorine into aluminum nitride. The diffusion of fluorine into aluminum nitride may lead to mechanical fracture, which reduces a lifetime of reactor components made of aluminum nitride. Composite ceramic materials, including ceramic mixtures of alumina and aluminum nitride, may remedy the deficiencies of aluminum nitride in reactor components while retaining its high temperature resistance, high chemical resistance, and high thermal conductivity. In fact, composite ceramic materials may open new possibilities in terms of material properties that aren't found in pure ceramic materials (e.g., alumina or aluminum nitride). Material properties such as volume resistivity, specific heat, thermal conductivity, thermal shock resistance, hardness, density, fracture toughness, etc. may be tuned by controlling a composition of the composite ceramic material.

Joining ceramic bodies made of composite ceramic materials, however, face many challenges. In some instances, the interface between ceramic bodies made of composite ceramic materials may fail to result in a joint, or at least result in a weak joint or a joint vulnerable to leakage. In some instances, the interface between ceramic bodies made of composite ceramic materials may be prone to chemical attack.

Co-firing is one example process for fabricating ceramic bodies. Co-firing forms monolithic structures where the entire ceramic structure and all of its components or subassemblies are fired in a kiln at the same time. Co-fired ceramic structures are made using a multilayered approach. While co-firing avoids having to join dissimilar members, co-firing may be unable to form complex ceramic structures with large thicknesses.

Brazing is an example process for joining ceramic bodies. A metal interlayer may such as aluminum, silver, or alloys thereof may be provided between ceramic bodies. The ceramic bodies are held in contact with the metal inter layer, where the metal interlayer may be heated to a temperature sufficient to melt the metal interlayer. The metal interlayer is cooled and solidified to form a bond. However, the metal interlayer used in brazing is typically prone to chemical attack. For example, corrosive gases such as fluorine gases and radicals may contaminate the brazed joint.

Diffusion bonding is another example process for joining ceramic bodies. Diffusion bonding is a solid-state joining technique that involves contacting surfaces of two or more ceramic bodies. High pressure is applied in conjunction with high temperature so that the ceramic bodies are welded or otherwise joined. However, diffusion bonding between composite ceramic materials or mixtures encounter problems so that a mechanical joint either fails to form or forms a mechanical joint vulnerable to leakage. This makes diffusion bonding of composite ceramic materials largely impractical.

Joining Techniques of Composite Ceramic Bodies

The present disclosure relates to joining composite ceramic bodies. At least one of the ceramic bodies may be a compositionally graded composite ceramic body so that a portion of the composite ceramic body is a single ceramic material or consists essentially of a single ceramic material. Specifically, the compositionally graded composite ceramic body is composed of two or more ceramic materials but terminates in a portion that is made of largely a single ceramic material. The portion of the compositionally graded composite ceramic body interfaces at a joint with another ceramic body. The other ceramic body may be: (1) compositionally graded ceramic body, (2) ceramic body made of a single ceramic material, or (3) ceramic body with a portion that interfaces at the joint and is made of a single ceramic material or consists essentially of a single ceramic material. The ceramic material interfacing at the joint is identical or largely identical for each of the ceramic bodies. In some implementations, the ceramic material may include alumina, aluminum nitride, or aluminum oxynitride. In some implementations, the ceramic bodies may be joined by diffusion bonding. That way, a composite ceramic body may be joined to form a hermetic (i.e., leak-tight) or substantially hermetic joint. In some implementations, the ceramic bodies may be joined to form a reactor component such as a showerhead or wafer pedestal implemented in a plasma processing apparatus.

Figure 3:
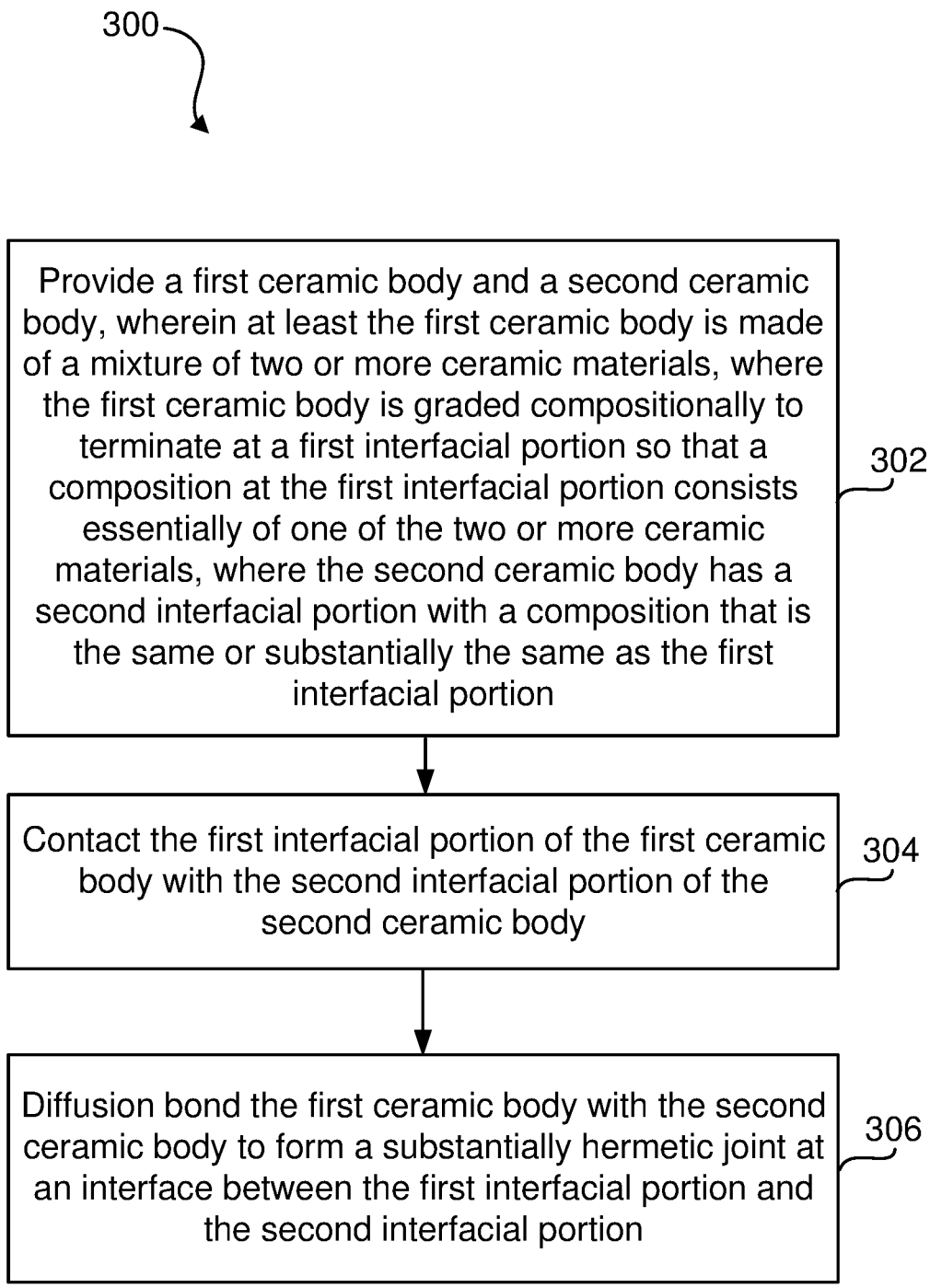
FIG. 3 illustrates a flow diagram of an example method of joining ceramic bodies for use in a semiconductor processing apparatus according to some implementations.

FIG. 3 illustrates a flow diagram of an example method of joining ceramic bodies for use in a semiconductor processing apparatus according to some implementations. The operations of a process 300 may be performed in different orders and/or with different, fewer, or additional operations. Aspects of the process 300 may be described with reference to FIGS. 1, 2, 4A-4C, and 5. In some implementations, the operations of the process 300 may be implemented, at least in part, according to software stored in one or more non-transitory computer readable media.

At block 302 of the process 300, a first ceramic body and a second ceramic body are provided, where at least the first ceramic body is made of a mixture of two or more ceramic materials. The first ceramic body is graded compositionally to terminate at a first interfacial portion so that a composition at the first interfacial portion consists essentially of one of two or more ceramic materials. The second ceramic body has a second interfacial portion with a composition that is the same or substantially the same as the first interfacial portion.

The first ceramic body is compositionally graded so that a composition of the first ceramic body varies across a thickness of the first ceramic body. This means that the composition of the first ceramic body varies between opposite ends of the first ceramic body, where the variation may be a composition gradient between a first surface and a second surface opposite the first surface. Accordingly, the composition of the first ceramic body can gradually change across its thickness. In some implementations, the first ceramic body can have multiple discrete layers with varying composition across the multiple layers.

By way of an example, the first ceramic body can be composed of at least a first ceramic material (A) and a second ceramic material (B). Adjacent to the first surface of the first ceramic body, a concentration of A may be high and a concentration of B may be low. Proceeding from the first surface to the second surface, the concentration of A may gradually decrease and the concentration of B may gradually increase across the thickness of the first ceramic body. For instance, the concentration of A may be 99 atomic % to 100 atomic % at the first surface and the concentration of B may be 0 to 1 atomic %, the concentration of ceramic material A incrementally decreases and the concentration of ceramic material B incrementally increases proceeding from the first surface towards the second surface. In some implementations, incremental changes layer-to-layer in the first ceramic body may be changes of about 0.5 atomic %, 1 atomic %, 2 atomic %, 3 atomic %, 5 atomic %, or 10 atomic %. Or, the incremental changes may be more gradual rather than in step-wise increments. In some implementations, the first interfacial portion may be a discrete layer at the first surface. The first interfacial portion may have a very high concentration of A. It will be understood that the concentration of materials in ceramic bodies generally refer to atomic percentages for final sintered ceramic bodies, though percentages for composites prior to mixing are generally referred to in terms of weight percentages or volume percentages.

At least the first ceramic body is composed of a combination of ceramic materials to form a composite ceramic or ceramic mixture. The ceramic mixture may provide improved properties that is otherwise not found in a single ceramic material alone. Depending on the composition of the ceramic mixture, properties such as volume resistivity, specific heat, thermal conductivity, thermal shock resistance, hardness, density, and fracture toughness, among other properties, may be tuned.

In some implementations, the ceramic mixture may include alumina, aluminum nitride, aluminum oxynitride, or combinations thereof. For example, material A may be aluminum nitride and material B may be alumina. In some implementations, the ceramic mixture may include spinel ($MgAl_2O_4$). In some implementations, the ceramic mixture may include garnet (e.g., $Mg_3Al_2Si_3O_{12}$). Other possible ceramic materials in the ceramic mixture may include yttrium oxide ($Y_2O_3$), yttrium fluoride (YF), or aluminum oxynitride. The composition of the first ceramic body may include a combination of any of the aforementioned ceramic materials. It will be understood, however, that the composition of the first ceramic body is not limited to the aforementioned ceramic materials and may include other combinations of ceramic materials known in the art.

In providing the first and second ceramic bodies, the first and second ceramic bodies may be manufactured separately and subsequently joined using a suitable joining technique. It may be too cost-prohibitive or too complex to form some ceramic structures monolithically. In other words, some complex ceramic structures may not be fabricated as a unitary body in a single sintering step. Instead, the complex ceramic structure may be fabricated by joining two or more ceramic bodies together. Each of the ceramic bodies may be fabricated according to a suitable ceramic sintering technique. For instance, some ceramic bodies may be produced by mixing binder with unfired ceramic powder to form a slurry/paste, drying the slurry/paste, molding the slurry/paste to form a "green" body, heating the "green" body to burn off the binder, and sintering at a high temperature to fuse ceramic particles together. Some ceramic bodies may be produced by tape casting to form thin ceramic tapes or "green" sheets, cutting and drying the "green" sheets, stacking the "green" sheets, laminating the "green" sheets, debinding, and sintering at a high temperature to fuse ceramic particles. The "green" sheets may have a certain amount of unfired powder particles accompanied with a binder material and/or sintering aids. The sintering can be performed by a hot press method or hot isostatic press method.

In some implementations, the complex ceramic structure may be a reactor component configured for use in a semiconductor processing apparatus or plasma processing apparatus. In some embodiments, the complex ceramic structure may be a wafer pedestal having a stem joined to a platen. The first ceramic body may be the stem and the second ceramic body may be the platen, or vice versa. After fabricating the stem and the platen, the ceramic bodies may be mated or otherwise joined together using a suitable joining technique. In some embodiments, the complex ceramic structure may be a showerhead having a stem joined to a backplate or a backplate joined to a faceplate. The first ceramic body may be the stem and the second ceramic body may be the backplate, or vice versa. Or, the first ceramic body may be the backplate and the second ceramic body may be the faceplate, or vice versa. After fabricating the stem and the backplate, or after fabricating the backplate and the faceplate, the ceramic bodies may be mated or otherwise joined together using a suitable joining technique.

A compositionally graded ceramic body may be fabricated using any number of techniques. As used herein, compositionally graded ceramics may be synonymously referred to as functionally graded materials (FGMs) or functionally graded ceramics. Compositionally graded ceramics may be formed of discrete layers or may be formed of a layer that transitions in composition continuously along a gradient.

In some implementations, the compositionally graded ceramic body may be composed of multiple discrete layers having varying concentrations. Multiple base powders, such alumina powders and aluminum nitride powders, may be mixed and molded into a "green" body or tape casted into a "green" sheet. Each of the "green" sheets or "green" bodies may be formed with different compositions. The "green" sheets or "green" bodies are molded into a desired shape prior to heat treatment by firing or sintering. The plurality of "green" sheets or "green" bodies may represent layers of varying compositions derived from ceramic powder mixtures that are arranged together and fired/sintered at a high temperature to form the compositionally graded ceramic body.

To illustrate, a first "green" sheet may be tape casted as a thin layer of a ceramic mixture having X % of a first ceramic material and Y % of a second ceramic material. X and Y may be numerical values that add up to about 100% or less, such as X=50% and Y=50%. A second "green" sheet may be tape casted as a thin layer of a ceramic mixture having X±5% of the first ceramic material and Y±5% of the second ceramic material, where the second "green" sheet is stacked on top of the first "green" sheet. A third "green" sheet may be tape casted as a thin layer of a ceramic mixture having X±10% of the first ceramic material and Y±10% of the second ceramic material, where the third "green" sheet is stacked on top of the second "green" sheet. Each of the "green" sheets are fabricated with incremental changes in composition and stacked on top of one another until a particular "green" sheet reaches 100% or approximately 100% of the first ceramic material or the second ceramic material. After stacking and/or laminating the "green" sheets, the thin layers of the ceramic mixtures may be hot pressed together to form the compositionally graded ceramic body. Each of the thin layers of the ceramic mixtures may have a thickness equal to or less than about 500 µm, equal to or less than about 200 µm, or equal to or less than about 100 µm. However, it will be understood that some commercial manufacturers may produce "green" sheets with minimum thicknesses equal to or greater than about 300 µm, or equal to or greater than about 600 µm. The compositionally graded ceramic body may be composed of 5 or more discrete layers, 10 or more discrete layers, or 20 or more discrete layers. By way of an example, each of the "green" sheets may be 100 µm in thickness and may be stacked together over at least ten discrete layers to form at least 1 mm of the compositionally graded ceramic body. A first layer may have 50 atomic % alumina and 50 atomic % aluminum nitride, a second layer may have 45 atomic % alumina and 55 atomic % aluminum nitride, a third layer may have 40 atomic % alumina and 60 atomic % aluminum nitride, and so forth until a tenth layer has 0 atomic % alumina and 100 atomic % aluminum nitride.

In some implementations, the compositionally graded ceramic body may be formed by a vapor deposition technique such as atomic layer deposition (ALD) or chemical vapor deposition (CVD), either of which may be plasma-assisted. CVD reactions are gas phase reactions that deposit reaction products on a wafer surface. CVD proceeds in a non-cyclic and continuous manner. In contrast, ALD proceeds in a cyclic manner. ALD uses surface-mediated deposition reactions to deposit thin films on a layer-by-layer basis. An ALD cycle typically includes operations to deliver and adsorb precursor on a wafer surface, followed by reacting the adsorbed precursor with one or more reactants to form a monolayer. A typical ALD cycle may include the following operations: (i) delivery and adsorption of precursor dose, (ii) optional purge, (iii) reacting the adsorbed precursor with reactant gas, and (iv) optional purge.

Suitable precursor(s) and reactant gas(es) are chosen to deposit thin films of ceramic materials such as aluminum nitride and alumina. For example, aluminum nitride may be deposited by introducing an aluminum-containing precursor and reacting the aluminum-containing precursor with a nitrogen-containing reactant such as nitrogen ($N_2$), ammonia ($NH_3$), and hydrazine ($N_2H_4$). Alumina may be deposited by introducing an aluminum-containing precursor and reacting the aluminum-containing precursor with an oxygen-containing reactant such as oxygen ($O_2$), ozone ($O_3$), water ($H_2O$), hydrogen peroxide ($H_2O_2$), nitrous oxide ($N_2O$), and alcohol (e.g., methanol). Examples of aluminum-containing precursors include but are not limited to aluminum alkoxides, trimethyl aluminum (TMA), and aluminum trichloride ($AlCl_3$).

In some implementations, the compositionally graded ceramic body may be formed by inkjet printing or other precision printing technique. For instance, inks containing ceramic particles and functional additives such as surfactants and binders are ejected through fine nozzles. Geometry and composition of the droplets can be specified accurately. Structures may be built up by precise dropwise combinations of materials on a substrate. This may facilitate continuous transitions from one composite to another using inkjet printing.

In some implementations, the compositionally graded ceramic body may be composed of a multi-layer stack having multiple discrete layers deposited by ALD, CVD, or other suitable vapor deposition technique. To deposit composite ceramic materials, and particularly a compositionally graded composite ceramic material, each discrete layer may be tuned to a certain composition so that the plurality of layers may have varying compositions. For example, a first ceramic material (A) and a second ceramic material (B) may be deposited in each layer according to a certain sequence or arrangement, e.g., A-A-A, A-A-B, A-B-A, B-A-A, B-B-A, B-A-B, A-B-B, B-B-B, and so forth. By varying the arrangement of deposited films of A and B, the composition of each discrete layer can be tuned. Thus, a multi-layer stack can have layers with a high concentration of A and a low concentration of B, layers with equal concentrations of A and B, and layers with low concentration of A and high concentration of B.

In some implementations, the compositionally graded ceramic body may be graded by controlling flow rate of precursors and/or reactant gases. This can occur by changing a flow rate of the reactant gas(es) relative to a flow rate of the precursor gas(es) during deposition. Or, this can occur by changing a flow rate of the precursor gas(es) relative to a flow rate of the reactant gas(es). By controlling flow rates in real-time, concentrations of materials in ceramic mixtures vary as the ceramic body is deposited. This allows composition tuning to be done by controlling gas flow rates or gas flow rate ratios during vapor deposition. Flow rate changes can occur gradually over time or in a step-wise manner.

By way of an example, a flow rate of aluminum-based precursor (e.g., TMA) can be held constant while a flow rate of oxygen-containing reactant (e.g., $O_2$) relative to a flow rate of nitrogen-containing reactant (e.g., $N_2$) changes. The flow rate of oxygen-containing reactant can increase or decrease over time while the flow rate of nitrogen-containing reactant can increase or decrease over time. The compositionally graded ceramic body can start with a high content of alumina at a bottom surface and gradually decrease approaching a top surface while the same compositionally graded ceramic body can start with a low content of aluminum nitride at the bottom surface and gradually increase approaching the top surface. Alternatively, the compositionally graded ceramic body can start with a high content of aluminum nitride at the bottom surface and gradually decrease approaching the top surface while the same compositionally graded ceramic body can start with a low content of alumina at the bottom surface and gradually or incrementally increase approaching the top surface.

There are many suitable techniques for manufacturing a compositionally graded ceramic body and the scope of the present disclosure is not limited to the foregoing methods. It will be understood that other techniques known in the art may be employed for manufacturing ceramic bodies that are compositionally graded. Thus, the foregoing methods are illustrative and not intended to limit the scope of the present disclosure.

Compositional grading in a ceramic body can be advantageous in reducing lattice mismatches, reducing internal stresses, and reducing an impact of differences in coefficient of thermal expansion (CTE) between dissimilar materials, among other advantages. The compositional grading can occur between two or more ceramic materials. The compositionally graded ceramic body can largely retain the desired material properties of a composite while providing graded transitions (i.e., gradations) of composition between the two or more ceramic materials. The gradation can terminate in a pure ceramic material instead of a ceramic mixture.

The first ceramic body is a compositionally graded ceramic body that terminates at the first interfacial portion that will bond or form a joint with another ceramic body. The first interfacial portion may have a thickness of at least about 5 μm, at least about 10 μm, at least about 20 μm, at least about 50 μm, or at least about 100 μm. Rather than a ceramic mixture or composite, the first interfacial portion is substantially composed of a pure ceramic material. Put another way, the first interfacial portion consists essentially of a single ceramic material. This means that the first interfacial portion is made of a single ceramic material and can tolerate other materials, dopants, or impurities in trace amounts. Other materials that may be present in the first interfacial portion do not materially change the basic properties of the first interfacial portion. As used herein, "substantially composed of a pure ceramic material" can refer to a concentration of one of the ceramic materials being equal to or greater than about 97 atomic % in the first interfacial portion. In some cases, the concentration of one or the ceramic materials in the first interfacial portion is equal to or greater than about 98 atomic %, equal to or greater than about 99 atomic %, or equal to or greater than about 99.5 atomic %. Generally speaking, higher purity provides for stronger joints with greater hermeticity or lower leak rates. Achieving higher purity may also require higher costs of fabrication. As such, the purity of the first interfacial portion may be determined at least in part by cost of fabrication considerations and a tolerable or acceptable leak rate upon joining the ceramic bodies, among other considerations.

Whereas the first ceramic body is compositionally graded, the second ceramic body may or may not be compositionally graded. The second ceramic body may be a composite of two or more ceramic materials, or the second ceramic body may be composed or substantially composed of a single ceramic material. Though the second ceramic body is not necessarily identical in composition and structure with the first ceramic body, the second ceramic body at least terminates in a portion (i.e., the second interfacial portion) that matches the first interfacial portion of the first ceramic body. The second interfacial portion has a composition that is the same or substantially the same as the first interfacial portion. As used herein, a composition that is "the same or substantially the same" may refer to the same ceramic material (e.g., AlN) in terms of chemical composition but different in terms of grades of the ceramic material (e.g., AlN HA12, AlN HA40, etc.). That way, a joint can be formed between the first interfacial portion and the second interfacial portion of pure ceramic materials. As used herein, the term "substantially the same" can refer to a concentration of the ceramic material in the second interfacial portion being no more than ±3 atomic % different than the concentration of the ceramic material in the first interfacial portion.

In some implementations, the second ceramic body is compositionally graded. The second ceramic body is compositionally graded so that a composition of the second ceramic body varies across a thickness of the second ceramic body. This means that the composition of the second ceramic body varies between opposite ends, where the variation may be a composition gradient between a first surface and a second surface opposite the first surface. Accordingly, the composition of the second ceramic body can gradually change across its thickness. In some implementations, the second ceramic body can have multiple discrete layers with varying compositions across the multiple layers. Aspects of compositional grading for ceramic bodies are described above and may apply to the second ceramic body.

In some implementations, the second ceramic body is a composite having the second interfacial portion composed substantially of a single ceramic material, the second interfacial portion formed on a remaining portion composed of a mixture of ceramic materials or a different ceramic material. The remaining portion underlying the second interfacial portion is not graded between two or more ceramic materials. Instead, the remaining portion includes a mixture of ceramic materials (e.g., alumina and aluminum nitride) distributed homogeneously or a different ceramic material (e.g., alumina or aluminum nitride) than the ceramic material of the second interfacial portion.

In some implementations, the second ceramic body is a single ceramic material or composed substantially of a single ceramic material. The entirety of the second ceramic body may be uniformly composed of the single ceramic material so that both the second interfacial portion and the remaining portion of the second ceramic body is the same composition. Having the second ceramic body composed of a single ceramic material may be more cost-efficient in some cases.

At block 304 of the process 300, the first interfacial portion of the first ceramic body is contacted with the second interfacial portion of the second ceramic body. For diffusion bonding to occur, an exposed surface of the first ceramic body is brought into contact with an exposed surface of the second ceramic body. In some implementations, the exposed surfaces of the first interfacial portion and the second interfacial portion are polished, planarized, or smoothed so that the exposed surfaces provide more extensive and direct contact with one another. The exposed surfaces are generally flat to ensure optimum contact at the formation of the joint.

At block 306 of the process 300, diffusion bonding of the first ceramic body with the second ceramic body is performed to form a substantially hermetic joint at an interface between the first interfacial portion and the second interfacial portion. Diffusion bonding as used herein may also be referred to as diffusion welding, solid-state bonding, or solid-state welding. Diffusion bonding may occur without the aid of an interlayer (e.g., metal interlayer) between the first interfacial portion and the second interfacial portion. Diffusion bonding is a process by which two nominally flat interfaces can be joined at an elevated temperature using an applied pressure for a time ranging from a few minutes to several hours. Parameters of time, temperature, and pressure can be varied to form the joint at the interface. In some implementations, the elevated temperature is between about 50% and about 95% of the absolute melting temperature of the ceramic material at the interface (i.e., the ceramic material of the first interfacial portion and the second interfacial portion).

Difficulties are often encountered at an interface when diffusion bonding is performed between composite ceramic materials. Without being limited by any theory, composite ceramic materials may comprise a mixture of different grains, and interdiffusion is limited at an interface when grains of a first ceramic material (A) interfaces with dissimilar grains of a second ceramic material (B). However, diffusion bonding of a single ceramic interface is not so limited and can produce relatively leak-tight joints.

The interface between the first interfacial portion and the second interfacial portion is engineered in a manner to produce a hermetic or substantially hermetic joint. In some implementations, gases may flow through channels in a one or both of the first ceramic body and the second ceramic body. Additionally or alternatively, the interior of one or both of the first ceramic body and the second ceramic body may need to be maintained within a desired pressure range (e.g., atmospheric pressure). Hermetic or substantially hermetic joints limit gas leakage from the ceramic bodies. As used herein, a "substantially hermetic joint" permits gas leakage at within an acceptable tolerance for a specific manufacturing application. The degree of hermeticity at the joint may depend on various factors such as the purity of the single ceramic material at the interface, the flatness of the first interfacial portion and the second interfacial portion, and conditions of time, temperature, and pressure applied during diffusion bonding, among other factors. It will be understood that hermeticity may be specified by a vacuum leak test. By way of an example, a helium leak rate of less than about $1\times10^{-9}$ cm$^3$/s of helium, though other applications may accept a higher leak rate or require a lower leak rate.

Figure 4A:
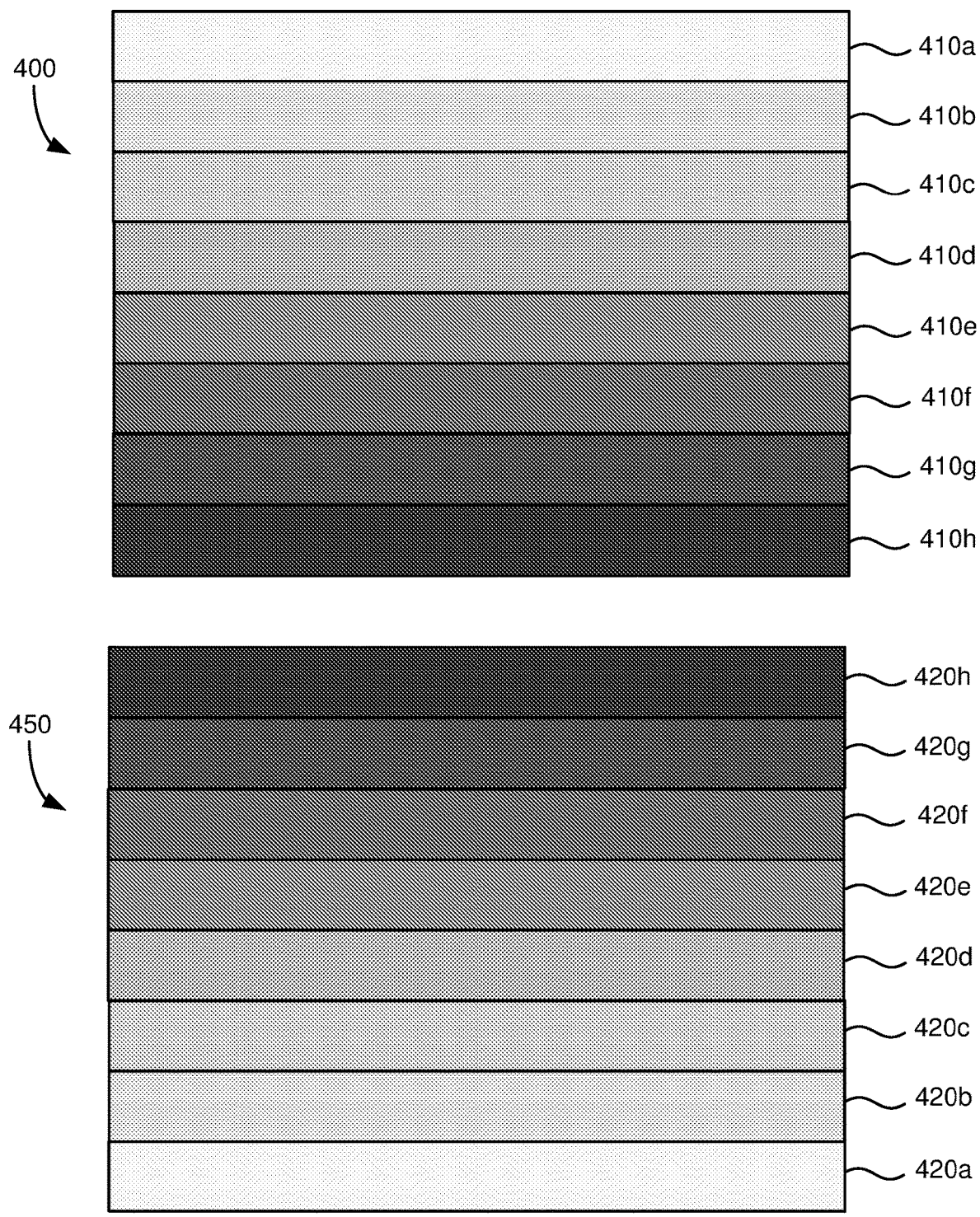
FIG. 4A shows a schematic illustration of a first ceramic body that is compositionally graded and a second ceramic body that is compositionally graded according to some implementations.

FIG. 4A shows a schematic illustration of a first ceramic body that is compositionally graded and a second ceramic body that is compositionally graded according to some implementations. The first ceramic body 400 includes a plurality of layers 410a, 410b, 410c, 410d, 410e, 410f, 410g, 410*h*. The second ceramic body 450 includes a plurality of layers 420*a*, 420*b*, 420*c*, 420*d*, 420*e*, 420*f*, 420*g*, 420*h*. Each of the first ceramic body 400 and the second ceramic body 450 is compositionally graded between at least two ceramic materials, including a first ceramic material (A) and a second ceramic material (B). The plurality of layers 410*a*, 410*b*, 410*c*, 410*d*, 410*e*, 410*f*, 410*g*, 410*h* have varying concentrations of A and B, and the plurality of layers 420*a*, 420*b*, 420*c*, 420*d*, 420*e*, 420*f*, 420*g*, 420*h* have varying concentrations of A and B. In some embodiments, the first ceramic material (A) is alumina and the second ceramic material (B) is aluminum nitride, or vice versa.

Regarding the first ceramic body 400, first layer 410*a* may include a concentration of A=65% and a concentration of B=35%, second layer 410*b* may include a concentration of A=70% and a concentration of B=30%, third layer 410*c* may include a concentration of A=75% and a concentration of B=25%, fourth layer 410*d* may include a concentration of A=80% and a concentration of B=20%, fifth layer 410*e* may include a concentration of A=85% and a concentration of B=15%, sixth layer 410*f* may include a concentration of A=90% and a concentration of B=10%, seventh layer 410*g* may include a concentration of A=95% and a concentration of B=5%, and eight layer 410*h* may include a concentration of A=100% and a concentration of B=0%. Regarding the second ceramic body 450, first layer 420*a* may include a concentration of A=65% and a concentration of B=35%, second layer 420*b* may include a concentration of A=70% and a concentration of B=30%, third layer 420*c* may include a concentration of A=75% and a concentration of B=25%, fourth layer 420*d* may include a concentration of A=80% and a concentration of B=20%, fifth layer 420*e* may include a concentration of A=85% and a concentration of B=15%, sixth layer 420*f* may include a concentration of A=90% and a concentration of B=10%, seventh layer 420*g* may include a concentration of A=95% and a concentration of B=5%, and eighth layer 420*h* may include a concentration of A=100% and a concentration of B=0%. When forming a joint at an interface between the eighth layer 410*h* of the first ceramic body 400 and the eighth layer 420*h* of the second ceramic body 450, the interface is composed of more than 97% of A for a single ceramic interface.

In some implementations, the first ceramic body 400 is a graded ceramic platen and the second ceramic body 450 is a graded ceramic stem. Each of the graded ceramic platen and the graded ceramic stem may be graded between alumina and aluminum nitride. In some cases, the joint may be largely aluminum nitride. In some cases, the joint may be largely alumina. In some other cases, the joint may be largely aluminum oxynitride.

Figure 4B:
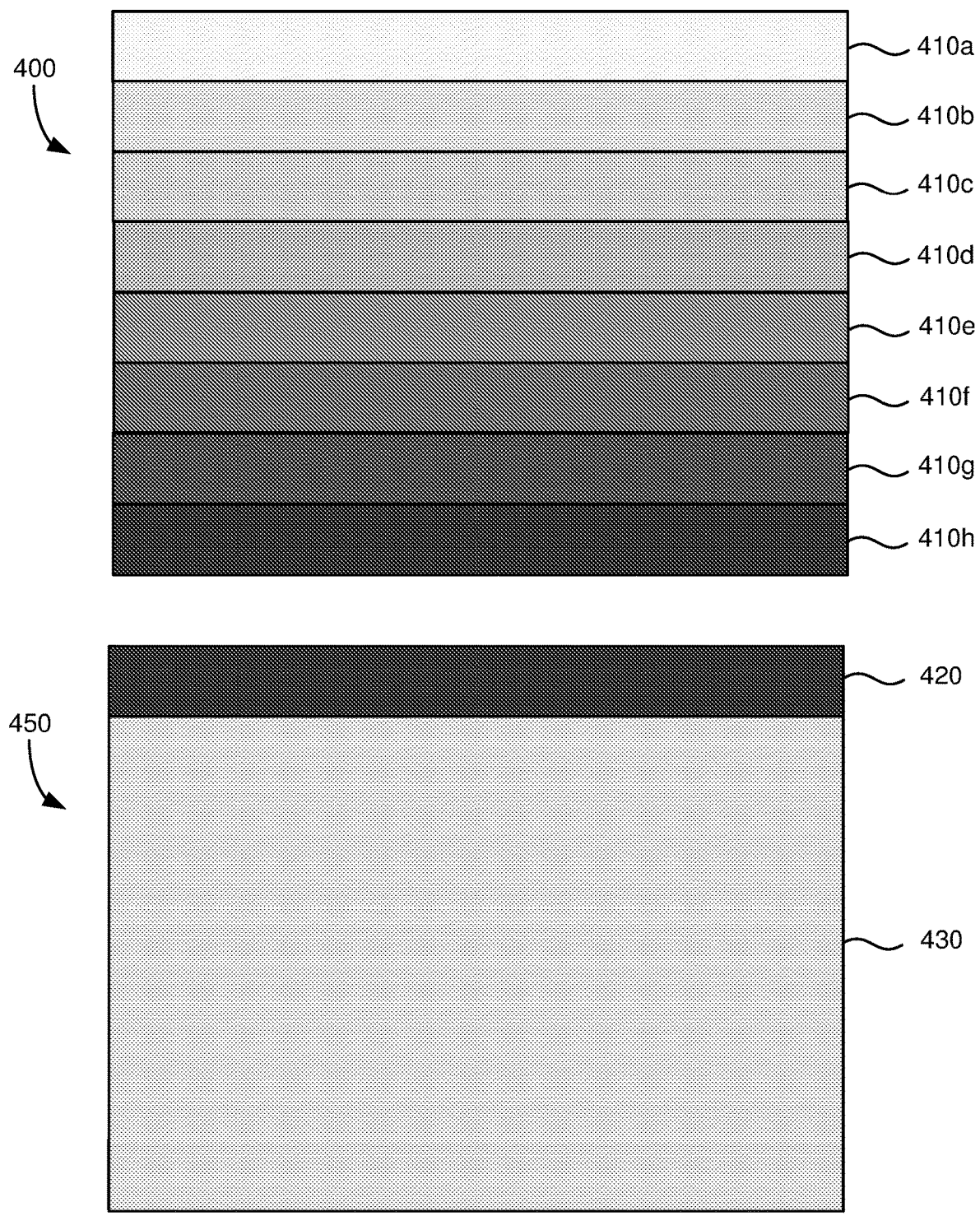
FIG. 4B shows a schematic illustration of a first ceramic body that is compositionally graded and a second ceramic body that has at least an interfacial portion composed of a single ceramic material according to some implementations.

FIG. 4B shows a schematic illustration of a first ceramic body that is compositionally graded and a second ceramic body that has at least an interfacial portion composed of a single ceramic material according to some implementations. As described above, the first ceramic body 400 includes a plurality of layers 410*a*, 410*b*, 410*c*, 410*d*, 410*e*, 410*f*, 410*g*, 410*h* each having varying concentrations of A and B. The second ceramic body 450 includes an interfacial layer 420 over a bulk layer 430.

Regarding the first ceramic body 400, first layer 410*a* may include a concentration of A=65% and a concentration of B=35%, second layer 410*b* may include a concentration of A=70% and a concentration of B=30%, third layer 410*c* may include a concentration of A=75% and a concentration of B=25%, fourth layer 410*d* may include a concentration of A=80% and a concentration of B=20%, fifth layer 410*e* may include a concentration of A=85% and a concentration of B=15%, sixth layer 410*f* may include a concentration of A=90% and a concentration of B=10%, seventh layer 410*g* may include a concentration of A=95% and a concentration of B=5%, and eight layer 410*h* may include a concentration of A=100% and a concentration of B=0%. Regarding the second ceramic body 450, interfacial layer 420 has a concentration of A=100% and a concentration of B=0%. That way, a joint at an interface between the eighth layer 410*h* of the first ceramic body 400 and the interfacial layer 420 of the second ceramic body 450 is a single ceramic interface. In some embodiments, the bulk layer 430 may include a mixture of A and B. For instance, the bulk layer 430 may have a concentration of A=90% and a concentration of B=10%.

In some implementations, the first ceramic body 400 is a graded ceramic platen and the second ceramic body 450 is a composite ceramic stem. Each of the graded ceramic platen and the composite ceramic stem may be include a mixture of alumina and aluminum nitride. In some cases, the joint may be largely aluminum nitride. In some cases, the joint may be largely alumina. In some other cases, the joint may be largely aluminum oxynitride.

Figure 4C:
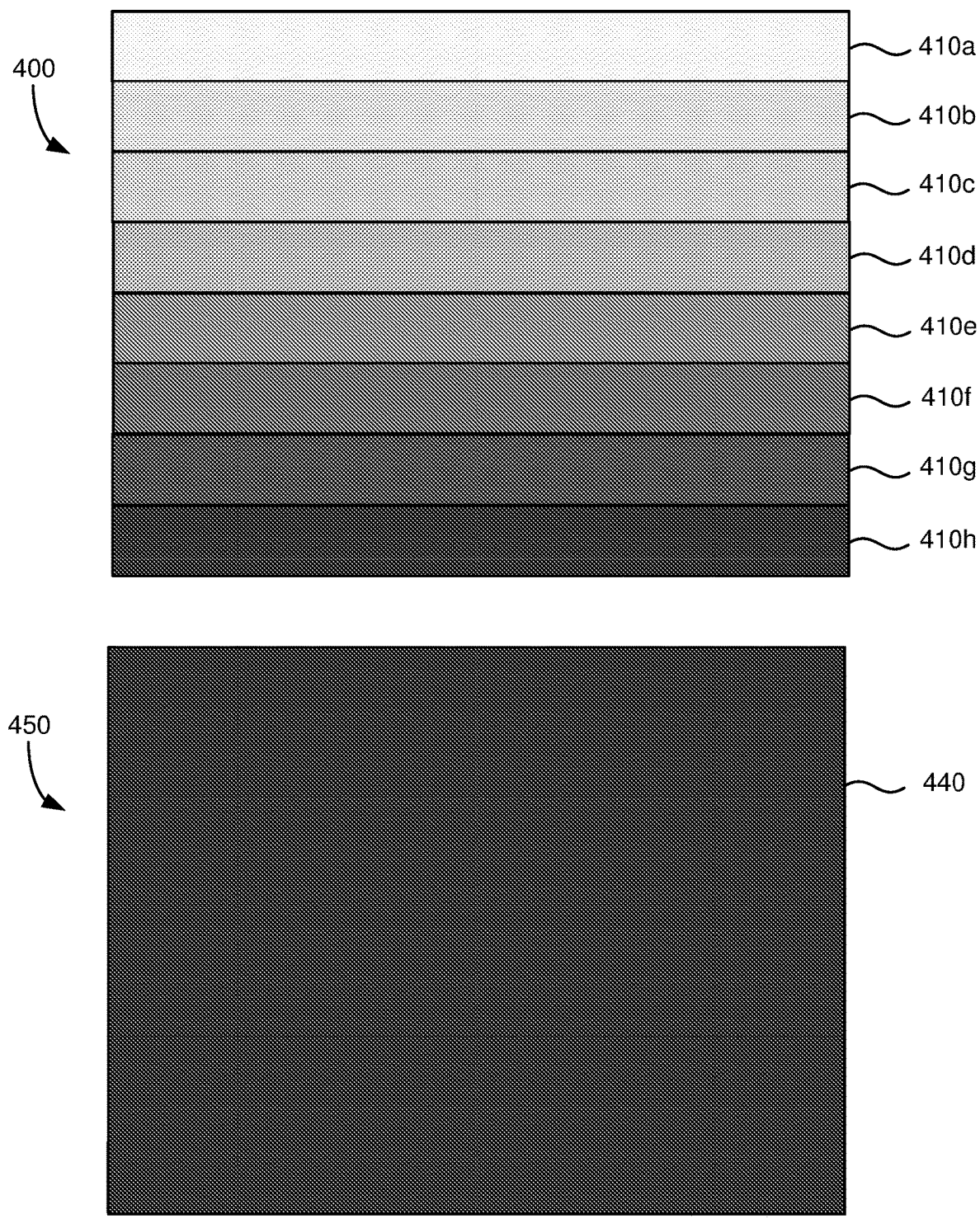
FIG. 4C shows a schematic illustration of a first ceramic body that is compositionally graded and a second ceramic body that is composed entirely of a single ceramic material according to some implementations.

FIG. 4C shows a schematic illustration of a first ceramic body that is compositionally graded and a second ceramic body that is composed entirely of a single ceramic material according to some implementations. As described above, the first ceramic body 400 includes a plurality of layers 410*a*, 410*b*, 410*c*, 410*d*, 410*e*, 410*f*, 410*g*, 410*h* each having varying concentrations of A and B. The second ceramic body 450 includes a bulk layer 440 made of a single ceramic material.

Regarding the first ceramic body 400, first layer 410*a* may include a concentration of A=65% and a concentration of B=35%, second layer 410*b* may include a concentration of A=70% and a concentration of B=30%, third layer 410*c* may include a concentration of A=75% and a concentration of B=25%, fourth layer 410*d* may include a concentration of A=80% and a concentration of B=20%, fifth layer 410*e* may include a concentration of A=85% and a concentration of B=15%, sixth layer 410*f* may include a concentration of A=90% and a concentration of B=10%, seventh layer 410*g* may include a concentration of A=95% and a concentration of B=5%, and eight layer 410*h* may include a concentration of A=100% and a concentration of B=0%. Regarding the second ceramic body 450, bulk layer 440 has a concentration of A=100% and a concentration of B=0%. That way, a joint at an interface between the eighth layer 410*h* of the first ceramic body 400 and the bulk layer 440 of the second ceramic body 450 is a single ceramic interface.

In some implementations, the first ceramic body 400 is a graded ceramic platen and the second ceramic body 450 is a ceramic stem. The graded ceramic stem may include a mixture of alumina and aluminum nitride. The ceramic stem may consist of alumina, aluminum nitride, or aluminum oxynitride. In some cases, the joint may be largely aluminum nitride. In some cases, the joint may be largely alumina. In some other cases, the joint may be largely aluminum oxynitride.

Figure 5:
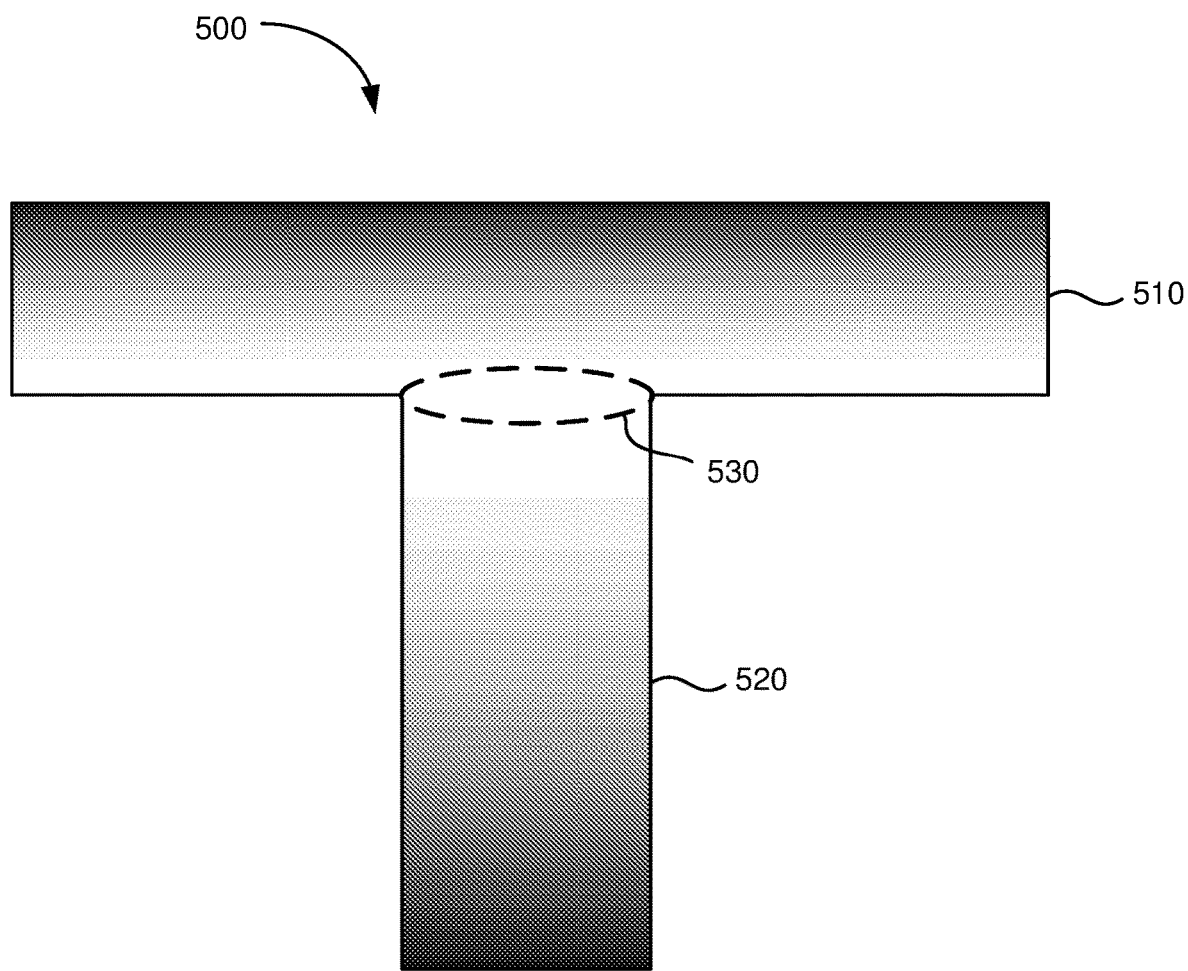
FIG. 5 shows a schematic illustration of a wafer pedestal including a ceramic stem joined to a compositionally graded ceramic platen according to some implementations.

FIG. 5 shows a schematic illustration of a wafer pedestal including a ceramic stem joined to a ceramic platen according to some implementations. A first ceramic body 510 is a ceramic platen of a wafer pedestal 500 and a second ceramic body 520 is a ceramic stem of the wafer pedestal 500. The first ceramic body 510 may be joined to the second ceramic body 520 at a joint 530. In some implementations, the joint 530 may be formed by diffusion bonding.

The first ceramic body 510 may be a ceramic mixture of two or more ceramic materials. The first ceramic body 510 may be compositionally graded between the two or more ceramic materials. The second ceramic body 520 may be a ceramic mixture of two or more ceramic materials or a single ceramic material. Where the first ceramic body 510 and the second ceramic body 520 terminate at the joint 530, the composition at the joint 530 is composed or substantially composed of a single ceramic material (i.e., one of the two or more ceramic materials).

In some implementations, the two or more ceramic materials include alumina and aluminum nitride. In some cases, the ceramic platen is a composite of alumina and aluminum nitride. The ceramic stem may be a composite of alumina and aluminum nitride, or simply composed of bulk alumina or bulk aluminum nitride.

With the inclusion of a material such as aluminum nitride, the wafer pedestal 500 may be advantageously resistant to chemical attack, particularly against fluorine-based species as often used in chamber dry cleans. Furthermore, the wafer pedestal 500 may exhibit high thermal conductivity and high temperature resistance with the inclusion of aluminum nitride. The presence of alumina in the wafer pedestal 500 may reduce cost and improve machinability. With the joint 530 composed of a single ceramic interface, a stronger and more leak-tight joint is formed.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of joining ceramic bodies for use in a semiconductor processing apparatus, the method comprising:
    providing a first ceramic body and a second ceramic body, wherein at least the first ceramic body is made of a mixture of two or more ceramic materials, wherein the first ceramic body is graded compositionally to terminate at a first interfacial portion so that a composition at the first interfacial portion consists essentially of one of the two or more ceramic materials, wherein the second ceramic body has a second interfacial portion with a composition that is the same or substantially the same as the first interfacial portion;
    contacting the first interfacial portion of the first ceramic body with the second interfacial portion of the second ceramic body; and
    diffusion bonding the first ceramic body with the second ceramic body to form a hermetic or substantially hermetic joint at an interface between the first interfacial portion and the second interfacial portion.

2. The method of claim 1, wherein the two or more ceramic materials are ceramic mixtures of at least aluminum nitride and alumina.

3. The method of claim 2, wherein a composition at the first interfacial portion and a composition at the second interfacial portion each consists essentially of aluminum nitride or alumina.

4. The method of claim 2, wherein the two or more ceramic materials are ceramic mixtures that further include aluminum oxynitride.

5. The method of claim 1, wherein the first ceramic body is a platen of a wafer pedestal and the second ceramic body is a stem of the wafer pedestal.

6. The method of claim 1, wherein the first ceramic body is a faceplate and/or backplate of a showerhead and the second ceramic body is a stem of the showerhead.

7. The method of claim 1, wherein the second ceramic body is graded compositionally to terminate at the second interfacial portion so that the composition at the second interfacial portion is the same or substantially the same as the first interfacial portion.

8. The method of claim 1, wherein a composition of the second ceramic body is the same or substantially the same ceramic material as the first interfacial portion.

9. The method of claim 1, further comprising:
    forming the first ceramic body to be compositionally graded between the two or more ceramic materials by depositing a plurality of layers of varying compositions by atomic layer deposition (ALD) or chemical vapor deposition (CVD).

10. The method of claim 1, further comprising:
    forming the first ceramic body to be compositionally graded between the two or more ceramic materials by forming a plurality of layers of varying compositions from powder mixtures and combining the plurality of layers by hot pressing.

11. The method of claim 1, wherein the first ceramic body includes a platen comprising a mixture of aluminum nitride and alumina and terminates in the first interfacial portion that consists essentially of aluminum nitride, and wherein the second ceramic body includes a stem comprising aluminum nitride, alumina, or combinations thereof and that terminates in the second interfacial portion that consists essentially of aluminum nitride.

12. The method of claim 1, wherein the first ceramic body includes a platen comprising a mixture of aluminum nitride and alumina and terminates in the first interfacial portion that consists essentially of alumina, and wherein the second ceramic body includes a stem comprising aluminum nitride, alumina, or combinations thereof and that terminates in the second interfacial portion that consists essentially of alumina.

13. The method of claim 1, wherein the first ceramic body includes a platen comprising a mixture of aluminum nitride and alumina and terminates in the first interfacial portion that consists essentially of aluminum oxynitride, and wherein the second ceramic body includes a stem comprising aluminum nitride, alumina, or combinations thereof and that terminates in the second interfacial portion that consists essentially of aluminum oxynitride.

14. The method of claim 1, wherein each of the first interfacial portion and the second interfacial portion has a thickness equal to or greater than about 10 µm.

15. A reactor component configured for use in a semiconductor processing apparatus, the reactor component comprising:
- a first ceramic body comprising a mixture of two or more ceramic materials, wherein the first ceramic body is compositionally graded to terminate in a first interfacial portion so that a composition of the first interfacial portion consists essentially of a single ceramic material of the two or more ceramic materials; and
- a second ceramic body, wherein the second ceramic body has a second interfacial portion so that a composition of the second interfacial portion is the same or substantially the same as the first interfacial portion, wherein the first interfacial portion and the second interfacial portion form a joint by diffusion bonding.

16. The reactor component of claim 15, wherein the two or more ceramic materials are ceramic mixtures of at least aluminum nitride and alumina.

17. The reactor component of claim 15, wherein the first ceramic body is a platen of a wafer pedestal and the second ceramic body is a stem of the wafer pedestal.

18. The reactor component of claim 15, wherein the first ceramic body is a faceplate and/or backplate of a gas distributor and the second ceramic body is a stem of the gas distributor.

19. The reactor component of claim 15, wherein the second ceramic body comprises a mixture of the two or more ceramic materials, wherein the second ceramic body is graded compositionally to terminate at the second interfacial portion so that the composition at the second interfacial portion is the same or substantially the same as the first interfacial portion.

20. The method of claim 15, wherein an interface between the first interfacial portion and the second interfacial portion forms a hermetic or substantially hermetic joint.

21. The method of claim 15, wherein each of the first interfacial portion and the second interfacial portion has a thickness equal to or greater than about 10 µm.

* * * * *